United States Patent [19]

Rossi et al.

[11] Patent Number: 4,827,110

[45] Date of Patent: May 2, 1989

[54] METHOD AND APPARATUS FOR MONITORING THE LOCATION OF WAFER DISKS

[75] Inventors: Alexander N. Rossi, Pleasanton; Mario N. Sancen, Antioch, both of Calif.

[73] Assignee: Fluoroware, Inc., Chaska, Minn.

[21] Appl. No.: 61,935

[22] Filed: Jun. 11, 1987

[51] Int. Cl.[4] ............................................. G06F 15/46
[52] U.S. Cl. .................................... 235/376; 235/380
[58] Field of Search .............................. 235/376, 380

[56] References Cited

U.S. PATENT DOCUMENTS 4,242,663 12/1980 Slobodin ............................. 235/380

*Primary Examiner*—Harold I. Pitts
*Attorney, Agent, or Firm*—Faegre & Benson

[57] ABSTRACT

A method and system for monitoring the process of a plurality of batches of semiconductor wafers or memory disks through a series of processing operations. Each batch is placed in a carrier in which it is transported to the locations where the processing operations are performed. Each carrier is provided with a transponder tag coded to be responsive to within reading range of a reader unit which transmits a radio frequency signal to the transponder tag and reads and decodes a phase modulated signal returned by the transponder tag to uniquely identify the carrier that is positioned within range of the reader unit. Further control apparatus receives information from the reader units to permit the monitoring process of semiconductor wafer or memory disk batches through multiple processing operations.

9 Claims, 2 Drawing Sheets

METHOD AND APPARATUS FOR MONITORING THE LOCATION OF WAFER DISKS

BACKGROUND OF THE INVENTION

1. Field of the Invention.

This invention relates to the identification and tracking of batches of objects through a manufacturing process. More specifically, it relates to a method for monitoring the progress of a plurality of batches of semiconductor wafers or memory disks through a multiplicity of processing operations at various locations within a plant facility.

2. Description of the Prior Art.

In the semiconductor manufacturing industry semiconductor wafers are moved through a manufacturing plant to a number of different locations where the semiconductor wafers are etched, cleaned, processed using photolithography operations, tested and subjected to various other manufacturing testing and processing operations. Similarly, memory disks are also moved through a sequence of manufacturing operations in a manufacturing facility.

It is common in the industry to handle the wafers or memory disks in batches contained within carriers specifically designed for the purpose of supporting the wafers or memory disks in the proper position for the manufacturing and processing machinery which may either process the disks or wafers while they remain in the carriers or removes them for a processing operation and then returns them to the carrier. A batch is defined and used hereinafter to mean one or more (up to the capacity of the carrier) of the semiconductor wafers or memory disks.

In a manufacturing plant, it is desirable to track the progress of a batch of wafers or memory disks through the manufacturing process. Heretofore this has been done on a manual basis either by generating paper records to track the progress of particular batches through the various manufacturing and processing operations or by some semi-automated system such as manual keyboard entry.

Conventional technology utilizing bar code readers and the like could also be used to provide a somewhat more convenient tracking of individual wafer carriers but the reading of the bar codes may require the reader to be placed in very close contact with the coded bar code strip and also may require the use of either visual light or infrared illumination supplied by the reader in order to provide a readout of the coded information. Additionally, bar code stickers would have to be applied to the carriers using some method. Present bar code stickers will not stick to carriers molded from Teflon or similarly slippery materials or survive the types or chemical baths in which the carriers are immersed Even attempts to place the bar code stickers in a laminate suitable to protect the sticker from the chemical baths is unsatisfactory because of possible difficulty in reading the bar codes accurately through most transparent materials and the possibility that those materials optically suitable for the job may not stick to the carriers.

It is also possible that the workers using a conventional bar code reader wand to read a coded strip on a carrier could introduce particulate contamination to the wafers or disks because of the necessity of the reader to be in very close proximity to the bar code in order to read it.

Another drawback which would be present if conventional bar code reader technology were used to provide identification of carriers is that it would not be possible to read the bar codes on the carriers if they were stored in boxes at some stage of the manufacturing and processing operations. The necessity of providing corresponding coding on the boxes themselves would be a definite drawback in the usage of a bar code method. It would therefore be quite important to the proper operation of an identification system to have the system be capable of identifying carriers where they are enclosed in shipper boxes constructed of plastic or similar materials.

Although methods of identifying objects using radio frequency interrogation of transponder tag structures have existed for the past 20 years, the application of those techniques to monitoring the progress of batches of semiconductor wafers or memory disks through processing and manufacturing operations has not heretofore occurred.

It is desirable to provide an identification and tracking system which utilizes RF interrogation of coded surface acoustic wave transponder structures to provide a means for identification and tracking of semiconductor wafer or memory disk carriers through manufacturing and processing locations within a plant.

BRIEF DESCRIPTION OF THE INVENTION

The present invention provides a method for monitoring the progress of a plurality of batches of semiconductor wafers or memory disks through a multiplicity of processing operations at various locations within a plant facility. The method includes the step of inserting each of the batches of wafers or memory disks in a carrier constructed and arranged for supporting the wafers or disks in parallel, axially arranged, spaced arrays. The carrier is adapted to permit the carrying out of processing operations at various locations within the plant without removal of the batch of semiconductor wafers or memory disks from the carrier. A transponder tag is provided for each carrier and coded to uniquely identify the carrier and a batch of wafers or disks contained therein. The proximity of each carrier to various locations within the processing facility is detected by a multiplicity of limited range reader units each of which is positioned at one of the various locations and is constructed and arranged for determining the unique identification of any carrier within its detection range. Carrier identification information from the reader units is stored and updated to monitor the progress of batches through processing operations.

DESCRIPTION OF THE PREFERRED EMBODIMENT

Figure 1:
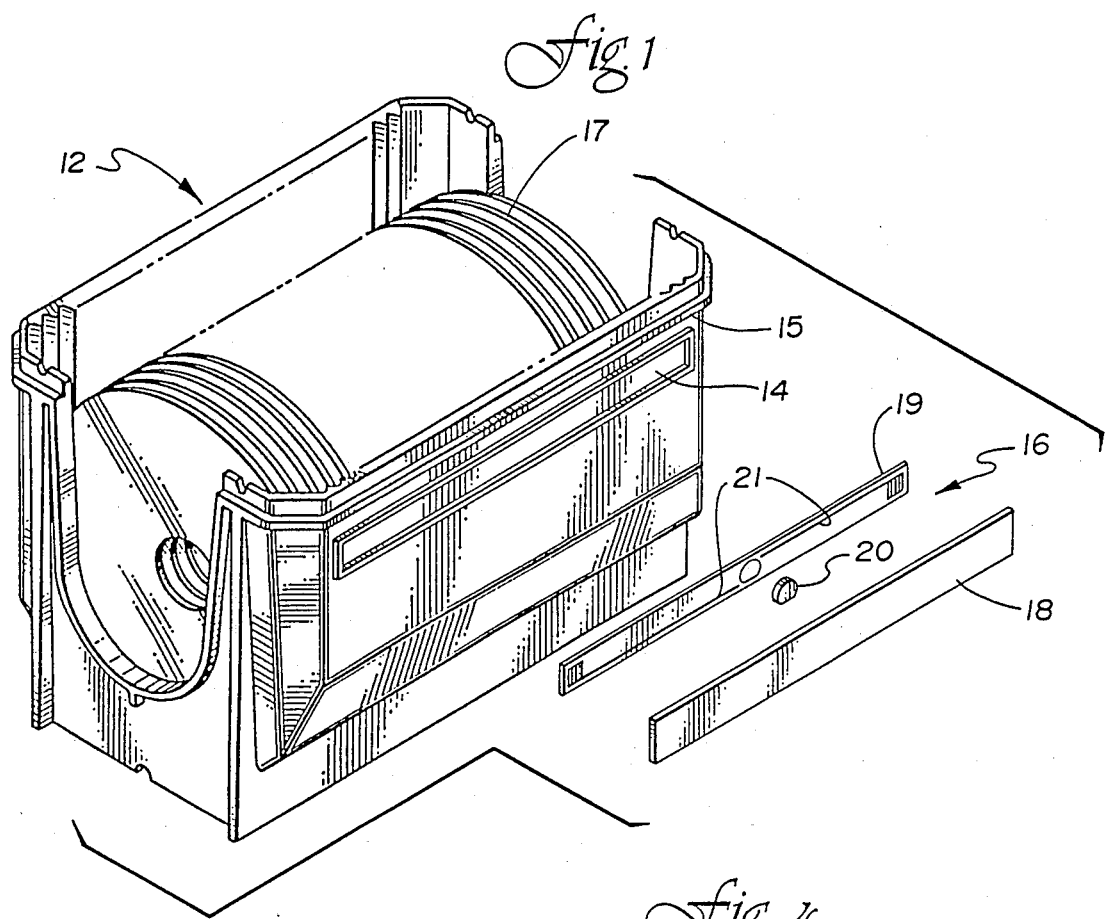
FIG. 1, is a partially exploded pictorial drawing of a typical carrier.

A typical wafer or disk carrier suitable for transporting and supporting a plurality of semiconductor wafers or memory disks in a parallel axially arranged and spaced array is identified generally with reference character 12 in FIG. 1. Because the technology herein is equally suitable for semiconductor wafers or computer memory disks, I am using the term disk hereinafter to designate either type of product as well as any other generally similar product having a thickness which is substantially less than the width. Such carriers have been offered commercially for a number of years by Fluoroware, Inc., 102 Jonathan Boulevard North, Chaska, Minn. 55318 and are in widespread use in the semiconductor manufacturing industry. In the past, such carriers have been tracked through manufacturing operations by associating paper records with particular carriers and the batches of wafers or disks within.

Molded carrier 12 has a recessed area 14, which is sized to hold transponder tag 16, in one of the planar side walls thereof near the top of the carrier. A cover 18 sized to fit and close the recessed area after the transponder tag 16 has been set in place is hermetically heat sealed to carrier 12. Placing the transponder tag in this location, which is just below the projecting lip 15 at the top of the carrier allows the carrier 12 to be used in the normal manner throughout the manufacturing process without interference.

Transponder tags generally suitable for use in object monitoring systems are sold by XCI Corporation, 1710 Stierlin Road, Mountain View, Calif. 94043. The transponder tag 16, in the preferred embodiment shown, consists of two major components: a substrate 19 on which small antenna 21 is bonded and a synthetic lithium niobate crystal 20. Antenna 21 may be one or more printed circuit conductors mounted on a printed circuit substrate in a dipole or other suitable arrangement.

Antenna 21 captures a signal transmitted from a reader, described below, and propagates it across the surface of surface acoustic wave crystal 20. The piezoelectric properties of lithium niobate crystal 20 generate a surface acoustic wave effect somewhat analogous to the propagation of waves caused by dropping a stone into a calm pond. A pattern layer of metallization on the surface of the crystal interrupts the progress of the surface wave as it propagates across the crystal. The interruptions create a phase-modulated encoding characteristic unique to each transponder tag. That phase-modulated signal can be interpreted as equivalent to a predetermined binary number. During manufacture a high resolution photolithographic masking process is used to deposit the layer of metallization to create the individual codes for each of the individual transponder devices. The antennas 21 for each of the transponders are essentially the same, the coding being achieved by varying the surface acoustic wave phase modulation characteristics of crystal 20.

It can be seen that the antennas 21 may be arranged in a dipole form with the axis of the dipole oriented perpendicular to the surfaces of wafers or disks 17 which are carried by carrier 12. It has been found that such an orientation maximizes the effective distance at which transponder 16 can be interrogated by the reader unit discussed below.

Figure 2:
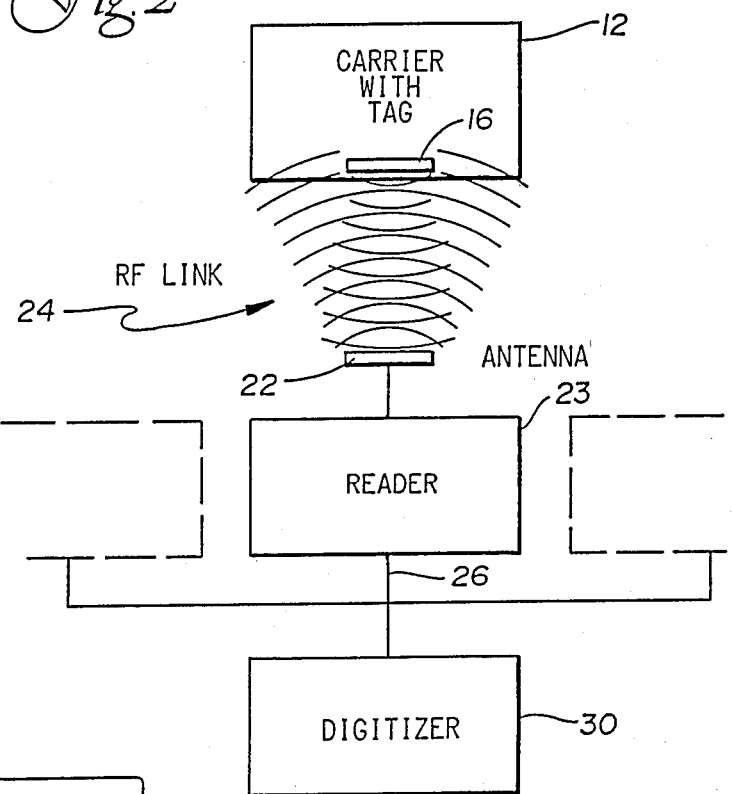
FIG. 2, is a block diagram of the monitoring system.

Turning now to FIG. 2, the system block diagram, the operation of the reader and transponder tag operation can be better understood. A single carrier 12 is shown for the purposes of illustration but it will be realized that in the manufacturing facility a plurality of carriers, which may or may not be identical, will be utilized to transport and store numerous batches of disks undergoing processing. A remote recognition reader 23 drives an associated antenna 22 to propagate a radio frequency signal marked with reference character 24. Suitable readers 23 are manufactured by XCI. The antenna 22 is integral to the reader and transmits and receives at a frequency of 915 megahertz, in the preferred embodiment, at a maximum power of 3 milliwatts. Because the reader 20 transmits at a high frequency and utilizes a low power RF signal, the identification of a transponder tag 16, and its associated carrier, can take place at distances from virtual contact to as much as six feet and can be accomplished even when the transponder tag 16 is not optically visible and indeed even when carrier 12 and its transponder tag 16 are enclosed in a box or on the other side of a wall from reader 23.

In a manufacturing facility, a plurality of readers 23 would normally be used, each of which is stationed at a location adjacent to the place where a particular manufacturing operation takes place. The reader outputs 26 are all connected to a converter or digitizer 30 which converts signals from the reader. In the preferred embodiment shown the readers have output signals which are converted from analog to digital form in the digitizer 30 or the computer 38 and decoded into a digital number uniquely identifying each of the transponder tags 16 and its associated carrier and semiconductor wafer or memory disk batch. The unique identification number associated with a transponder tag 16 and the output signals from a particular reader 23 that detected it allows a master computer 38 to determine at any point in time which of the carriers 12 is at a location of interest within the processing facility.

Figure 3:
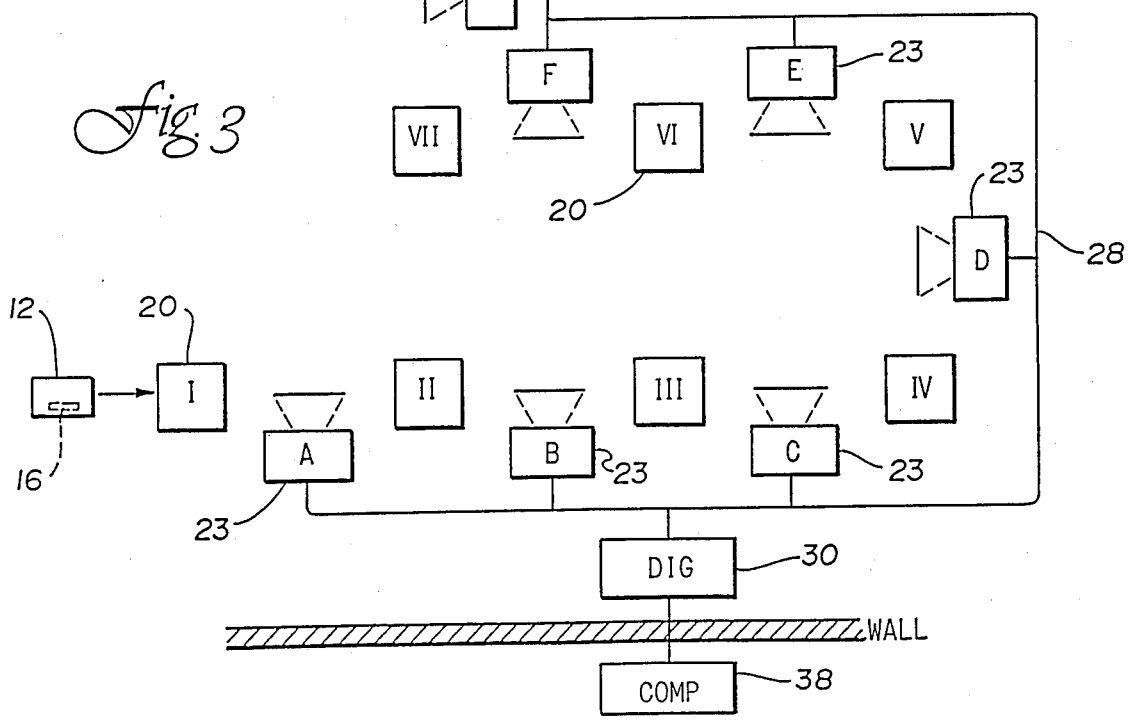
FIG. 3, is a schematic layout of a typical plant facility.

FIG. 3 illustrates a typical factory application where multiple remote readers designated 23 are each stationed at appropriate locations designated as stations I through VIII within the processing facility. One or more readers 23 may be positioned adjacent a particular station to monitor carriers as they are received or dispatched from the station or reaches an intermediate location at a particular station. The outputs of the readers 23 A through H are connected to a transmission line 28 which links them via converter 30 with computer 38 which can be positioned at any convenient location inside or outside of the manufacturing facility. As carriers 12 bearing unique transponders 16 move from station to station within the facility the presence of the carrier at various stations can be verified and logged by computer 38 which polls individual readers A through H.

Figure 4:
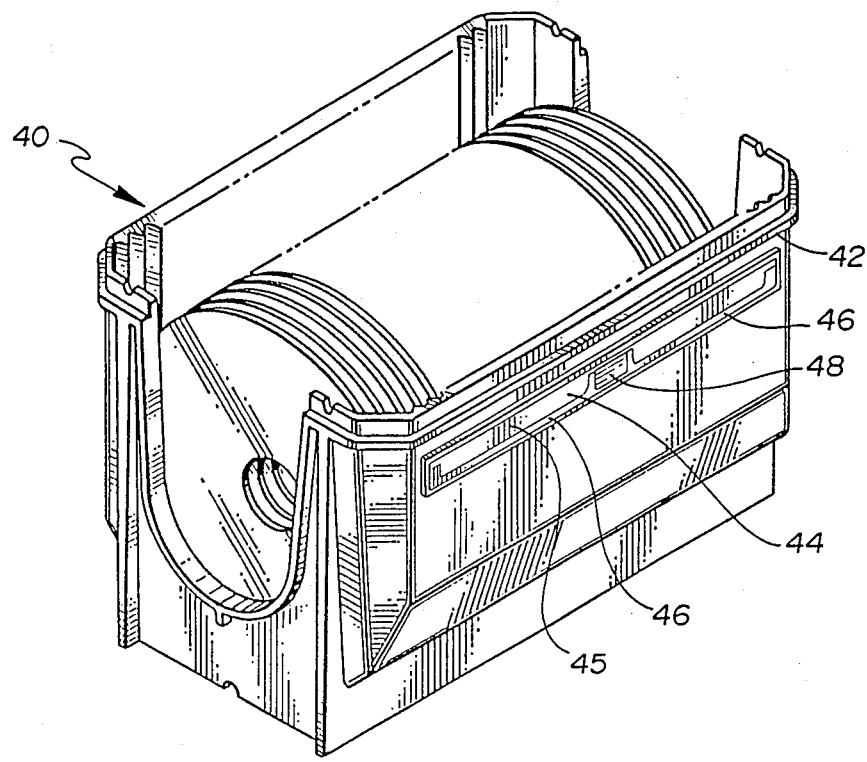
FIG. 4, is a pictorial of a different embodiment of a typical carrier with a transponder affixed using an alternative method.

FIG. 4 shows an alternate embodiment of a typical carrier 40 suitable for transporting and supporting a plurality of semiconductor wafers or memory disks in a parallel axially arranged and spaced array.

Carrier 40 has a transponder tag 44 bonded to it on the planar surface of one of the walls thereof near the top of the carrier. The surface to which tag 44 is secured may or may not be recessed to assist in mounting the tag.

Transponder tag 44, in the alternate embodiment shown, consists of a small antenna 46 and a synthetic lithium niobate crystal 48 which are mounted on a substrate 45 which completely encloses the crystal 48 and antenna 46. The connection between the crystal 48 and antenna 46 may be a conductive soldered or welded connection or may be made by inductive coupling. Antenna 46 captures a signal transmitted from a reader 23, and propagates it across the surface of crystal 48.

The transponder tag 44 may typically be secured to the wall of the wafer carrier 14 using any suitable bonding which is sufficiently resistant to the chemicals to which carrier 14 is exposed during processing operations.

It will be realized, by those skilled in the art, that various additions and modifications of the method and system disclosed herein may be made without departing from the essential features of novelty of the invention which are intended to be defined and secured by the appended claims.

What is claimed is:

1. A method for monitoring the progress of a plurality of batches of disks through a multiplicity of operations at several locations comprising the steps of:

inserting each batch of disks into a carrier constructed and arranged for supporting the disks in a parallel, axially arranged spaced array;

providing each carrier with a transponder tag constructed, arranged and coded for uniquely identifying the carrier and the batch inserted therein;

detecting the presence of each carrier at one of the several locations by operating a multiplicity of limited range reader units, each of which is positioned adjacent to one of the locations, the reader units being constructed and arranged for determining the identification cf any transponder tag within its detection range; and monitoring the progress of at least one batch of disks through various locations by updating and storing location information received from the reader units.

2. A system for tracking batches of disks through a plurality of operations comprising:

a plurality of carriers, each of which is adapted for carrying a batch of at least one disks;

a plurality of transponder tags, each of which is mounted on the outside surface of a vertical wall of a carrier, each tag including a transmitting antenna oriented perpendicular to the plane of the disks;

at least one remote recognition reader constructed and arranged for transmitting an RF signal to the transponder tag and receiving a coded RF response therefrom indicative of the identity of a particular batch of disks and providing an output signal characteristic thereof; and control means for receiving the output from the readers and providing a control signal indicative of which carrier is within the range of which reader.

3. The invention of claim 2, wherein the transponder tag includes a surface acoustic wave crystal adapted for modifying the phase of a received signal in accordance with a predetermined code and wherein the crystal is inductively coupled to the antenna.

4. The invention of claim 3 wherein each of the reader units transmits a radio frequency signal to a transponder tag within its detection range and wherein the transponder tag receives the signal and returns a phase modulated signal coded to uniquely identify the transponder tag and the carrier upon which it is mounted.

5. The invention of claim, 2 wherein the trans-ponder tag is mounted on the carrier by:

inserting the transponder tag in a recess in a surface of the carrier, the recess being constructed and arranged for supporting the transponder tag perpendicular to the plane of disks carried in the carrier; and sealing the transponder tag in the recess with a cover means constructed and arranged for covering and sealing the transponder tag.

6. The invention of claim 2 wherein the transponder tag is comprised of:

printed circuit antenna means mounted on a base; and a surface acoustic have transducer mounted on the base, the transducer having at least one flat surface thereof mounted to the base with the antenna means operatively coupled to the transducer.

7. The invention of claim 6 wherein the transducer package includes transducer antenna means and wherein the antenna means is operatively coupled to the transducer antenna means by inductive coupling.

8. The invention of claim 7 wherein the transducer package is operatively coupled to the antenna by a conductive connection.

9. The invention of claim 2 wherein each of the reader units transmits a radio frequency signal to a transponder within its detection range which receives the signal and returns a phase modulated signal coded for uniquely identifying the transponder tag and the carrier upon which it is mounted.

* * * * *

UNITED STATES PATENT AND TRADEMARK OFFICE
CERTIFICATE OF CORRECTION

PATENT NO. : 4,827,110

DATED : May 2, 1989

INVENTOR(S) : Alexander N. Rossi and Mario N. Sancen

It is certified that error appears in the above-identified patent and that said Letters Patent is hereby corrected as shown below:

Claim 6, line 4, delete "have" and insert -- wave --

Signed and Sealed this

Second Day of January, 1990

*Attest:*

JEFFREY M. SAMUELS

*Attesting Officer*     *Acting Commissioner of Patents and Trademarks*